(12) United States Patent
Liou et al.

(10) Patent No.: US 8,928,112 B2
(45) Date of Patent: Jan. 6, 2015

(54) SHALLOW TRENCH ISOLATION

(71) Applicant: United Microelectronics Corp., Hsin-Chu (TW)

(72) Inventors: En-Chiuan Liou, Tainan (TW); Po-Chao Tsao, New Taipei (TW); Chia-Jui Liang, Tainan (TW); Jia-Rong Wu, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/337,170

(22) Filed: Jul. 21, 2014

(65) Prior Publication Data

US 2014/0332920 A1    Nov. 13, 2014

Related U.S. Application Data

(63) Continuation of application No. 13/736,082, filed on Jan. 8, 2013, now Pat. No. 8,823,132.

(51) Int. Cl.
*H01L 29/00* (2006.01)
*H01L 29/06* (2006.01)

(52) U.S. Cl.
CPC .................. *H01L 29/0649* (2013.01)
USPC ............ 257/506; 257/510; 257/524; 257/622

(58) Field of Classification Search
USPC .................. 257/506, 510, 524, 622
See application file for complete search history.

(56) References Cited

U.S. PATENT DOCUMENTS

| | | |
|---|---|---|
| 5,989,978 A | 11/1999 | Peidous |
| 6,881,646 B2 | 4/2005 | Ishitsuka |
| 7,642,171 B2 | 1/2010 | Ingle |
| 8,232,176 B2 | 7/2012 | Lubomirsky |
| 8,415,256 B1 | 4/2013 | Nickel |
| 8,530,329 B2 | 9/2013 | Choi |
| 2003/0199151 A1 | 10/2003 | Ho |
| 2004/0152342 A1 | 8/2004 | Li |
| 2004/0248375 A1 | 12/2004 | McNeil |
| 2006/0121394 A1 | 6/2006 | Chi |
| 2007/0004170 A1 | 1/2007 | Kawasaki |

*Primary Examiner* — Thanh V Pham
(74) *Attorney, Agent, or Firm* — Winston Hsu; Scott Margo

(57) ABSTRACT

A shallow trench isolation (STI) and method of forming the same is provided. The STI structure includes an upper insulating portion and a lower insulating portion, where the lower insulating portion includes a first insulator and an insulating layer surrounding the first insulator, the upper insulating portion includes a second insulator and a buffer layer surrounding the second insulator. A part of the buffer layer interfaces between the first insulator and the second insulator, and the outer sidewall of the buffer layer and the sidewall of the first insulator are leveled.

6 Claims, 8 Drawing Sheets

SHALLOW TRENCH ISOLATION

CROSS REFERENCE TO RELATED APPLICATIONS

This continuation application claims the benefit of allowed U.S. patent application Ser. No. 13/736,082, filed on Jan. 8, 2013, and incorporated herein by reference.

BACKGROUND OF THE INVENTION

1. Field of the Invention

The present invention relates generally to shallow trench isolation structures, and more particularly, to shallow trench isolation structures which can reduce the depletion of silicon substrates caused by the flowable chemical vapor deposition (FCVD) process.

2. Description of the Prior Art

One of the persistent challenges faced in the development of semiconductor technology is the desire to increase the density of circuit elements and interconnections on substrates without introducing unwanted interactions between them. Unwanted interactions are typically prevented by providing gaps or trenches that are filled with electrically insulating material to isolate the elements both physically and electrically. Shallow trench isolations (STI) are one of the isolating structures widely adopted in integrated circuits (IC) to provide electrical isolation between adjacent semiconductor devices formed in a substrate. In the application of a CMOS IC, STIs are typically formed between like kinds of NMOS or PMOS transistors in a given well or substrate to suppress the leakage current between neighboring devices and to prevent CMOS latch-up from happening, which typically causes device failure. STIs may also be used in the manufacture of fin field effect transistor (FinFET) device to isolate fin structures.

As circuit densities increase, however, the widths of these gaps or trenches decrease, thereby increasing their aspect ratios and making the gaps progressively more difficult to be filled without leaving voids. The formation of voids when the gap is not filled completely is undesirable because they may adversely affect the operation of the completed device, such as by trapping impurities within the insulating material. Accordingly, as the trend in the semiconductor industry keeps going towards more densely packed devices, it will be desirable to find new methods of depositing dielectric materials into the trends with increasing the aspect ratios and to develop novel STI structures.

SUMMARY OF THE INVENTION

To manufacture shallow trench isolation (STI) structures with increased aspect ratios, a novel shallow trench isolation structure and a method of forming the same are provided in the present invention. A Flowable Chemical Vapor Deposition (FCVD) process is used in the method of present invention to achieve excellent gap-filling ability, and a shallow trench isolation structure with discontinuous upper and lower insulating portions is manufactured through the method of forming a buffer layer in the trench before the FCVD process.

One object of the present invention is to provide a novel shallow trench isolation structure comprising an upper insulating portion and a lower insulating portion in a trench of a substrate, wherein the lower insulating portion includes a first insulator and an insulating layer on the sidewall and the bottom of the first insulator, the upper insulating portion includes a second insulator and a buffer layer on the sidewall and the bottom of the second insulator, a part of the buffer layer interfaces between the first insulator and the second insulator, and the outer sidewall of the buffer layer and the sidewall of the first insulator are leveled.

Another object of the present invention is to provide a novel shallow trench isolation structure comprising an upper insulating portion and a lower insulating portion in a trench of a substrate, wherein the lower insulating portion includes a first insulator and an insulating layer on the sidewall and the bottom of the first insulator, the upper insulating portion includes a second insulator and a buffer layer on the sidewall of the second insulator, the first insulator and the second insulator are connected, and the outer sidewall of the buffer layer and the sidewall of the first insulator are leveled.

Still another object of the present invention is to provide a shallow trench isolation structure comprising a plurality of first insulators in a substrate, a common insulating layer surrounding the sidewall and the bottom of said first insulators in said substrate, and insulating portions of said substrate on said common insulating layer.

Still another object of the present invention is to provide a method of forming shallow trench isolation structures comprising the steps of forming a trench in a substrate, filling a first insulating layer in the lower portion of the trench and defining a recess at the upper portion of the trench, forming a buffer layer on the sidewall of the recess, filling a second insulating layer in the recess, and performing a steam annealing process to transform the substrate surrounding the first insulating layer into an oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
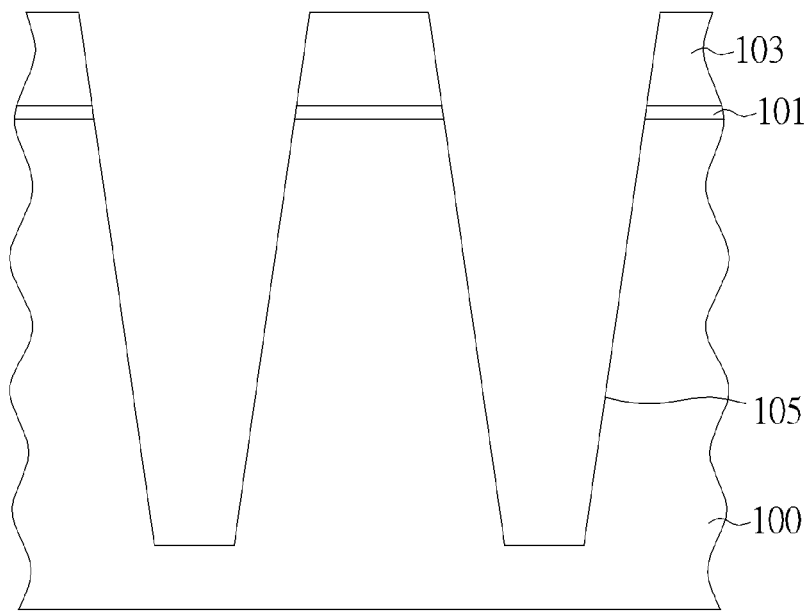
FIGS. 1-7 are cross-sectional views illustrating the process flow for manufacturing a shallow trench isolation structure in accordance with the first embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims. Unless otherwise defined, all terms (including technical and scientific terms) used herein have the same meaning as commonly understood by one of ordinary skill in the art to which this invention belongs.

Figure 6:
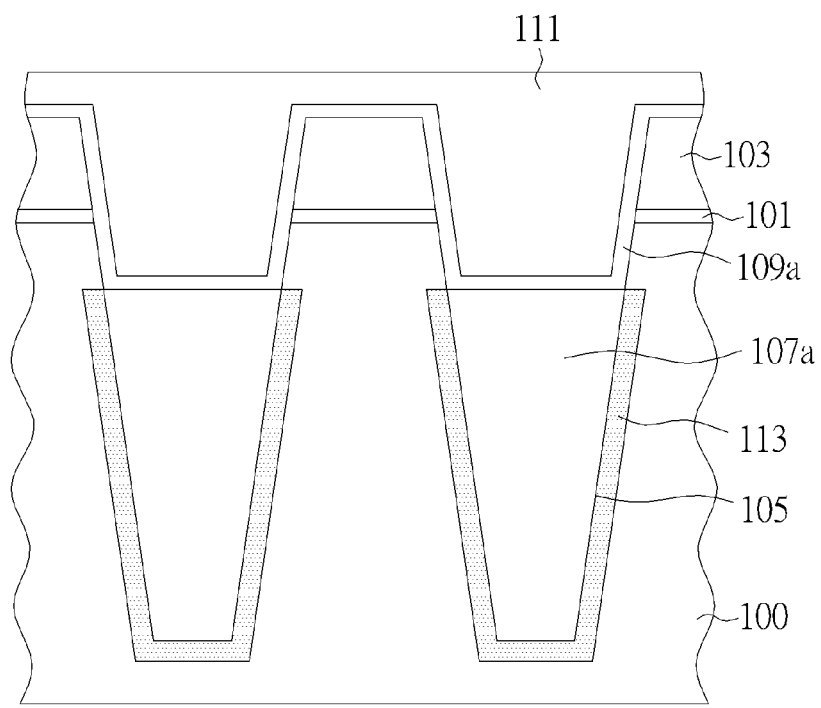
Figure 7:
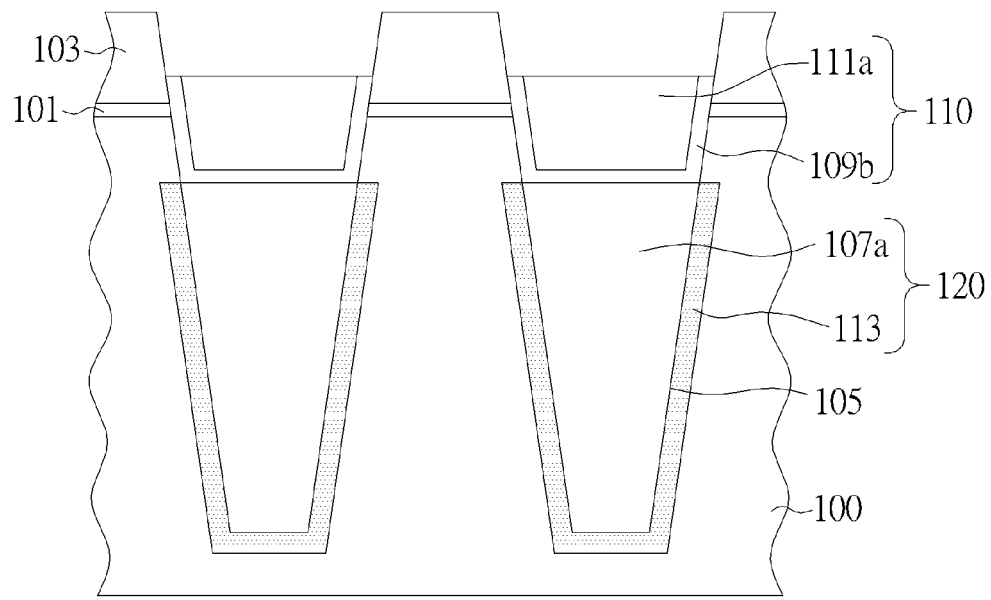
Figure 8:
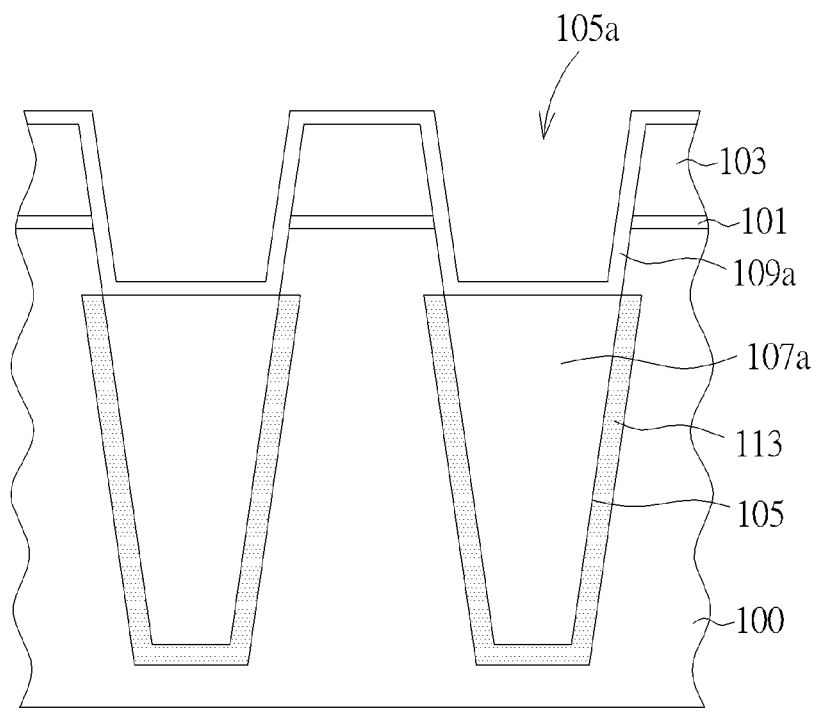
FIGS. 8-10 are cross-sectional views illustrating the process flow for manufacturing a shallow trench isolation structure in accordance with the second embodiment of present invention.
Figure 9:
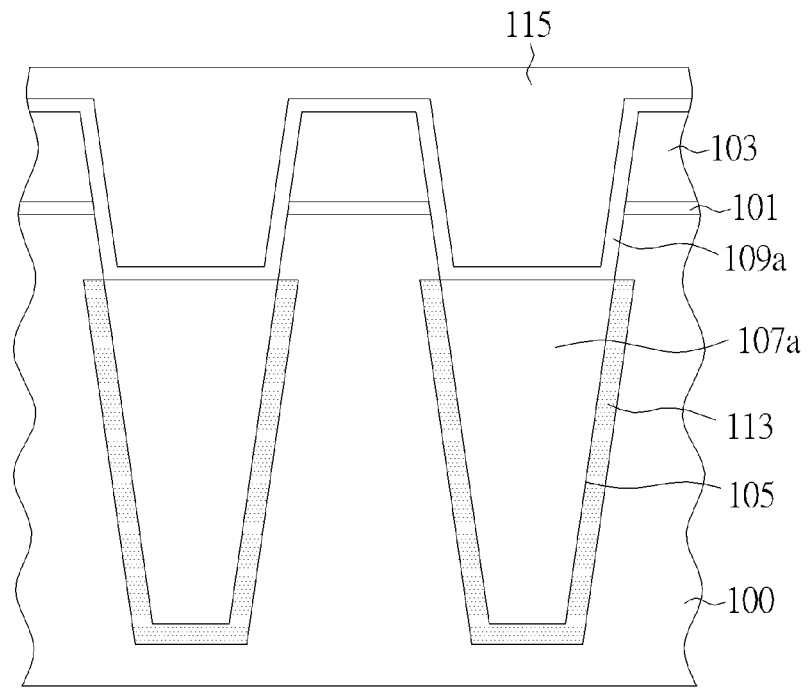
Figure 10:
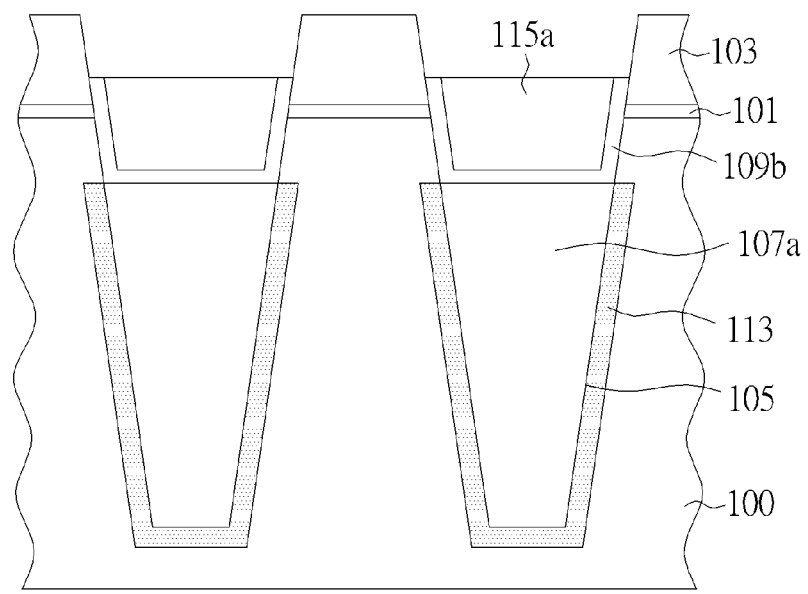
Figure 11:
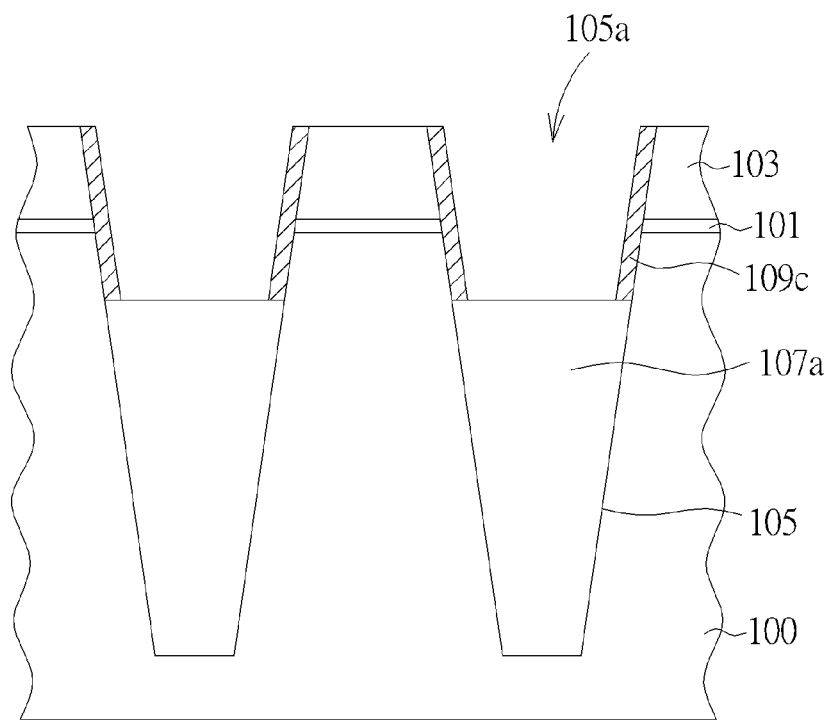
FIGS. 11-12 are cross-sectional views illustrating the process flow for manufacturing a shallow trench isolation structure in accordance with the third embodiment of present invention.
Figure 12:
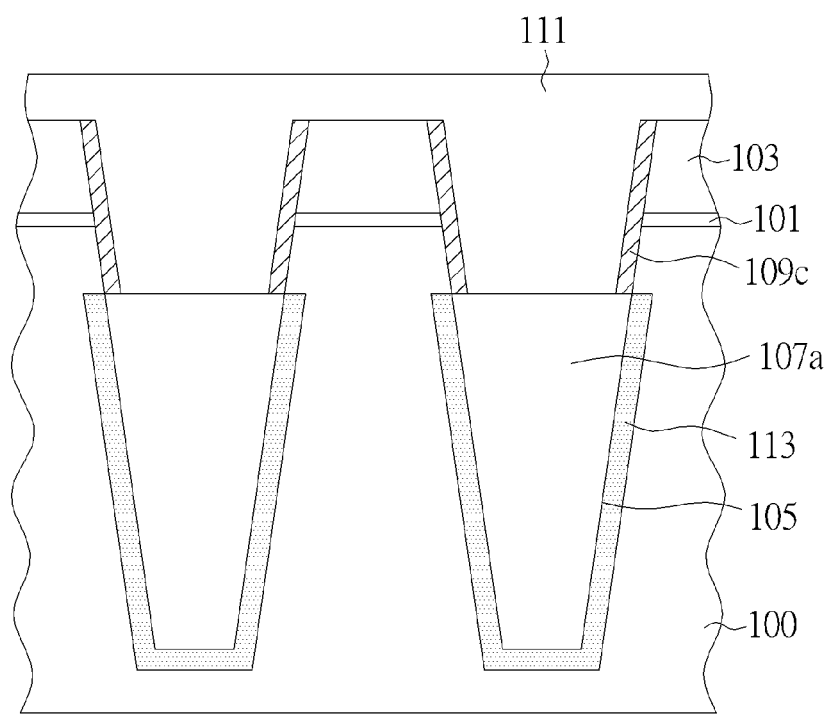

The embodiments will now be explained with reference to the accompanying drawings to provide a better understanding of the process of the present invention, wherein FIGS. 1-7 are cross-sectional views illustrating the process flow for manufacturing a shallow trench isolation structure in accordance with the first embodiment of present invention, FIGS. 8-10 are cross-sectional views illustrating the process flow for manufacturing a shallow trench isolation structure in accordance with the second embodiment of present invention, and FIGS. 11-12 are cross-sectional views illustrating the process flow for manufacturing a shallow trench isolation structure in accordance with the third embodiment of present invention.

First, please refer to FIG. 1, a substrate 100 is provided as the base of the whole semiconductor structure. The substrate 100 may be, but not limited to, a silicon substrate, an epitaxial silicon substrate, a silicon germanium (SiGe) substrate, a silicon carbide (SiC) substrate, or a silicon-on-insulator (SOI) substrate, etc. The substrate 100 may be provided with predetermined NMOS regions and PMOS regions and corresponding P-wells and N-wells. A pad oxide layer 101 and a mask layer 103 may be formed on the semiconductor substrate 100. The pad oxide layer 101 may be a thin film comprising silicon oxide formed through a thermal oxidation process. The pad oxide layer 101 may act as an adhesive layer between the semiconductor substrate 100 and the mask layer 103. The pad oxide layer 101 may also act as an etch stop layer for the etching mask layer 103. In an embodiment, the mask layer 103 may be made of silicon nitride and formed through a low-pressure chemical vapor deposition (LPCVD) process for example. In other embodiments, the mask layer 103 is formed through thermal nitridation of silicon, plasma enhanced chemical vapor deposition (PECVD), or plasma anodic nitridation. The mask layer 103 is used as a hard mask during the photolithographic and etching processes. The mask layer 103 may be first patterned to define the trench patterns. An etching process is then performed to form trenches 105 in the underlying substrate 100, wherein the trench has a depth of 2300 Å. Please note that the above-mentioned process may not only be used to form a trench with high aspect ratio, but also can be used to form a plurality of parallel fin structures in the manufacture of fin field effect transistor (FinFET) devices.

Figure 2:
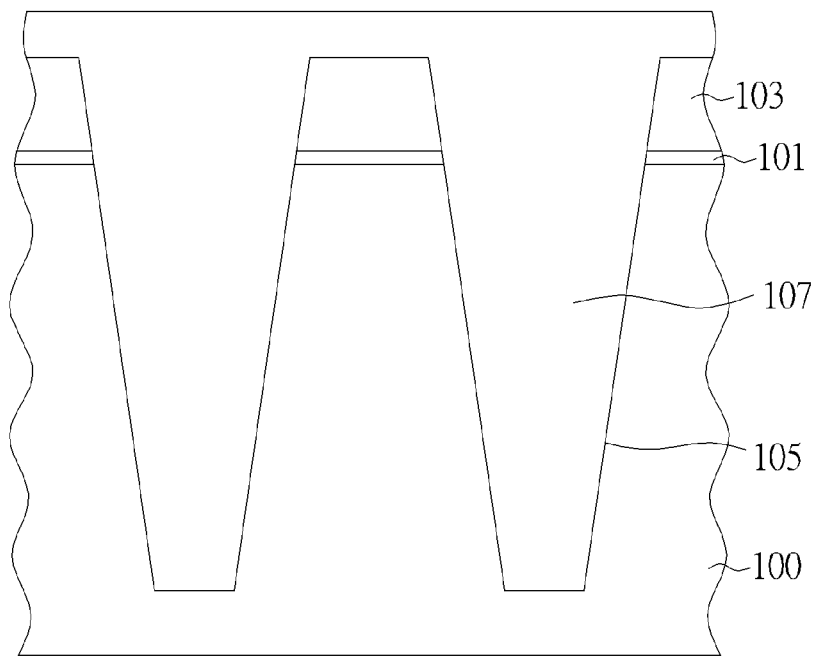

After the trench 105 is formed, please refer to FIG. 2, a flowable chemical vapor deposition (FCVD) process is performed to fill a first insulating layer 107 into the trench 105. Unlike conventional methods of adopting high-density plasma chemical vapor deposition (HDP-CVD) process to fill undoped silicon glass (USG) in the trench, the use of FCVD process may achieve excellent gap-filling ability which is suitable to the nowadays memory and logic process designs at the 20 nm and below technology node. The FCVD process fills the gaps or trenches with extreme dimensions, may having aspect ratios of up to 30:1, including those with highly irregular or complex profiles. In the FCVD process, flowable dielectrics may be filled into the trenches 105. Those flowable dielectrics may be silicon oxide type dielectrics formed from the reaction of oxygen-containing and silicon-containing precursors. For example, the oxide dielectric may be formed from the reaction of remotely generated radical atomic oxygen (i.e., the oxygen-containing precursor) and an organosilicon precursor such as tetra-methylorthosilicate (TMOS), i.e. the silicon-containing precursor. Following a partial or complete filling of the gap, the flowable dielectric may be treated (e.g., cured, baked, etc.) to harden the dielectric, thereby forming a first insulating layer 107. Alternatively, the above-mentioned curing or baking process may be performed concurrently in later well implant annealing step.

Figure 3:
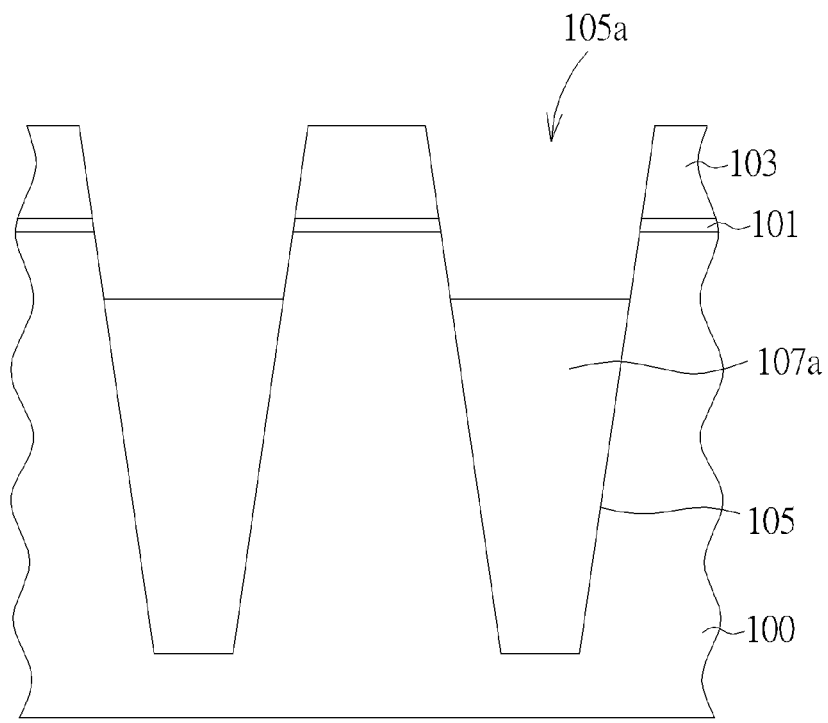

After the first insulating layer 107 is formed in the trench 105, please refer to FIG. 3, a chemical mechanical polishing process and/or an etch-back process are performed to remove a part of the first insulating layer 107 on the mask layer 103 at the upper portion of the trench 105, thereby forming a first insulator 107a at the lower portion of the trench 105 and defining a recess 105a at the upper portion of the trench 105. The formation of recess 105a is essential to the manufacture of a STI structure with discontinuous upper and lower insulating portions in the following processes of the present invention. Preferably, the depth of recess 105a is larger than the one of the devices to be formed, for example, larger than the depth of source/drain or fin structures.

Figure 4:
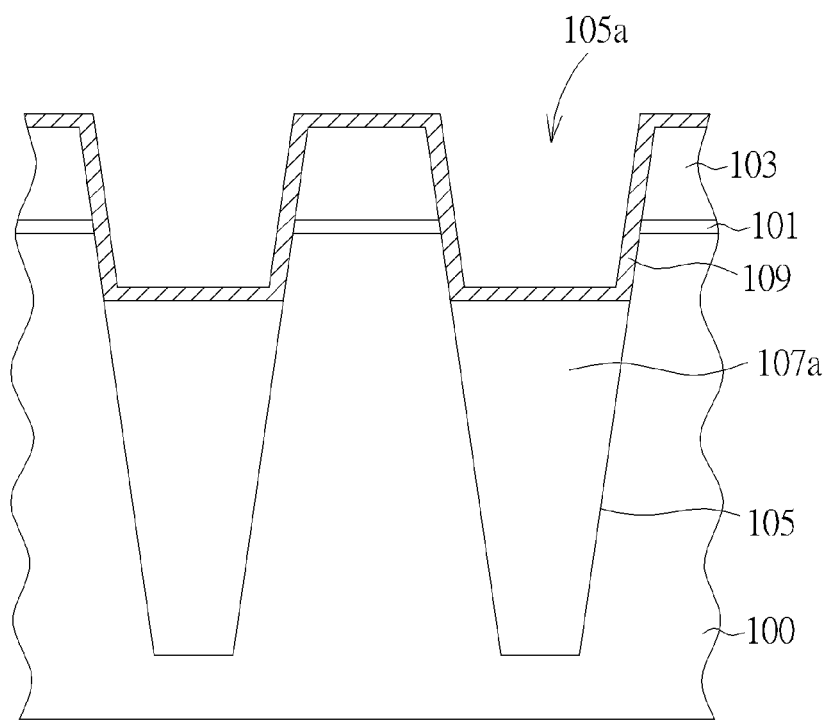

After the recess 105a and the first insulator 107a are formed, as shown in FIG. 4, a buffer layer 109 is conformally formed on the surface of recess 105a and mask layer 103. The buffer layer 109 may be formed through a low-pressure chemical vapor deposition (LPCVD) process or a plasma-enhanced chemical vapor deposition (PECVD) process using the material of a stress buffer film (SBF), silicon nitride (SiN), or silicon carbonitride (SiCN), etc. In this embodiment, the buffer layer 109 functions as a sacrificial layer to be oxidized for the adjacent substrate in following processes. The buffer layer 109 also isolates the discontinuous upper and lower insulating portions of the STI structure in the present invention. Detailed description will be shown in following embodiments.

Figure 5:
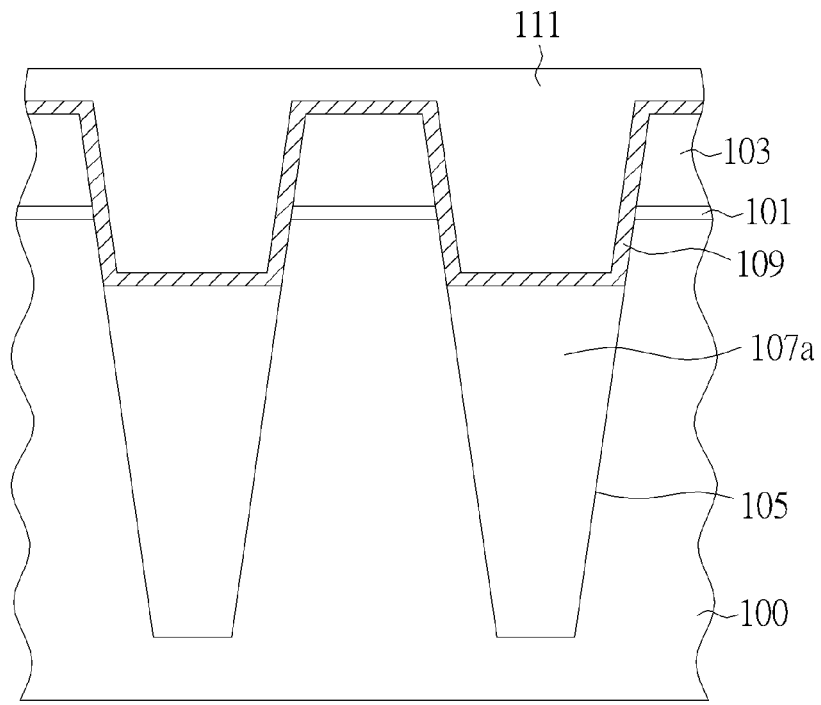

After the buffer layer 109 is deposited, as shown in FIG. 5, another insulating layer is formed. For example, perform the same FCVD process to fill a second insulating layer 111 in the recess 105a. The material of second insulating layer 111 and first insulating layer 107a may be the same, such as silicon oxide type dielectric. It is clearly shown in the figure that the buffer layer 109 serves as an interface to prevent the contact of second insulating layer 111 and the substrate 100.

After the second insulating layer 111 is formed, as shown in FIG. 6, a steam annealing process is performed to transform the substrate 100 surrounding the first insulator 107a into an oxide layer (also referred as an insulating layer) 113, such as a silicon oxide layer. During the steam annealing process, the oxygen atoms in the first insulator 107a diffuse into the adjacent substrate 100 and react with the substrate to form an oxide layer due to the high annealing temperature (ex. 700° C.). Please note that in the present invention, the oxygen atoms in second insulator cannot diffuse directly into the adjacent substrate 100 due to the isolation of the buffer layer 109. Therefore, as it is clearly shown in the figure, no oxide layer is formed in the substrate 100 surrounding the second insulating layer 111. Rather, in the condition that the material of buffer layer 109 is a stress buffer film, it is buffer layer 109 been transformed into an oxide layer 109a.

After the steam annealing process, as shown in FIG. 7, a chemical mechanical polishing process and/or an etch-back process are performed to remove a part of the second insulating layer 111 and of the oxide layer 109a on the mask layer 103 and at the upper portion of the trench 105, thereby forming a second insulator 111a and an adjacent buffer layer 109b. The top surface of the second insulator 111a is lower than the adjacent mask layer 103. At this stage, the STI structure of the present invention is completed.

According to the process flow of the above-mentioned embodiment, a novel STI structure is provided in the present invention. Please refer again to FIG. 7, the STI structure includes an upper insulating portion 110 and a lower insulating portion 120 with a buffer layer 109b interfacing therebetween, wherein the upper insulating portion 110 includes a second insulator 111a and the buffer layer 109b on the sidewall and the bottom of the second insulator 111a. The lower insulating portion 120 includes a first insulator 107a and an insulating layer (i.e. oxide layer) 113 on the sidewall and the bottom of the first insulator 107a. A part of the buffer layer 109b interfaces between the first insulator 107a and the second insulator 111a. In this embodiment of the present invention, since the insulating layer 113 is formed through the oxidation of the substrate 100, it is clearly shown in the figure that the upper insulating portion 110 and lower insulating portion 120 of the STI structure are discontinuous. However, the outer sidewall of the buffer layer 109b of the upper insulating portion 110 is leveled (i.e. smooth and no zigzag) with the sidewall of the first insulator 107a of the lower insulating portion 120.

The general process flow and the STI structure formed thereof are illustrated in the above-mentioned embodiment and the FIGS. 1-7. However, multiple variations of method and structure may be included in present invention. Those variations will be illustrated in following embodiments.

Please refer to FIGS. 8-10 which are cross-sectional views illustrating the process flow of manufacturing a shallow trench isolation structure in accordance with the second embodiment of present invention. In this embodiment, the steam annealing process may be performed before the deposition of second insulating layer 111. As shown in FIG. 8, the steam annealing process is performed after the formation of buffer layer 109, so that the substrate 100 surrounding the first insulator 107a is oxidized and transformed into an insulating layer 113, and the buffer layer 109 is transformed into an oxide layer 109a. Subsequently, as shown in FIG. 9, a second insulating layer 115 is deposited on the oxide layer 109a and in the recess. This process is similar to the step shown in FIG. 6. The difference between the present embodiment and previous embodiment is that, in present embodiment, since the steam annealing is performed before the deposition of the second insulating layer 115, the second insulating layer 115 is preferably formed by sub-atmospheric chemical vapor deposition (SACVD). The material of second insulating layer 111 and 115 may be different. For example, the material of second insulating layer 115 may be silicon oxide.

Thereafter, as shown in FIG. 10, a chemical mechanical polishing process and an etch-back process similar to the one shown in FIG. 7 are performed to remove a part of the second insulating layer 115 and of the oxide layer 109a on the mask layer 103 and at the upper portion of the trench 105, thereby forming a second insulator 115a and an oxide liner 109a surrounding therearound. The top surface of the second insulator 115a is lower than the adjacent mask layer 103. At this stage, the STI structure of present invention is completed.

Please refer now to FIG. 11-12 which are cross-sectional views illustrating the process flow for manufacturing a shallow trench isolation structure in accordance with the third embodiment of the present invention. In this embodiment, the buffer layer 109 functions as a pure blocking layer which is not oxidized by the steam annealing process. The material of buffer layer 109 may be selected from silicon nitride (SiN) or silicon carbonitride (SiCN). After the buffer layer 109 is formed, as shown in FIG. 11, a selective etching process is first performed to remove a part of the buffer layer 109 on the top surface of the first insulator 107a, thereby forming a spacer 109c structure on the mask layer 103 and the substrate 100. Subsequently, as shown in FIG. 12, the same FCVD process is performed to fill a second insulating layer 111 in the recess 105a. The material of second insulating layer 111 may be silicon oxide type dielectric. A steam annealing process is then performed to transform the substrate 100 surrounding the first insulator 107a into an insulating layer 113, while the buffer layer 109 wouldn't be transformed into an oxide layer due to its material selection. It is clearly shown in the figure that the STI structure in this embodiment is different from the one shown in FIG. 7. In this embodiment, the upper first insulator of the STI structure is connected to the lower second insulator, and the buffer layer 109 is a spacer rather than a liner.

Figure 13:
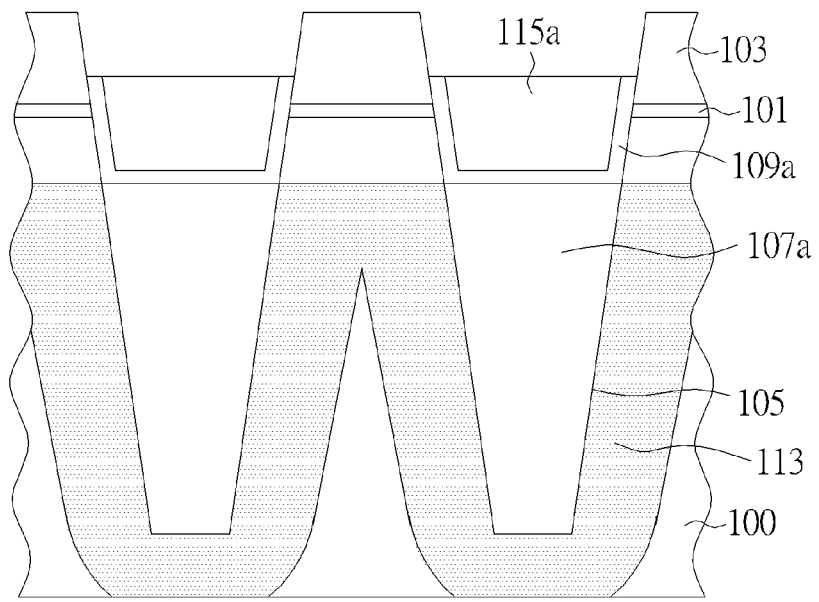
FIG. 13 is a cross-sectional view illustrating two shallow trench isolation structures with a common oxide layer.
Figure 14:
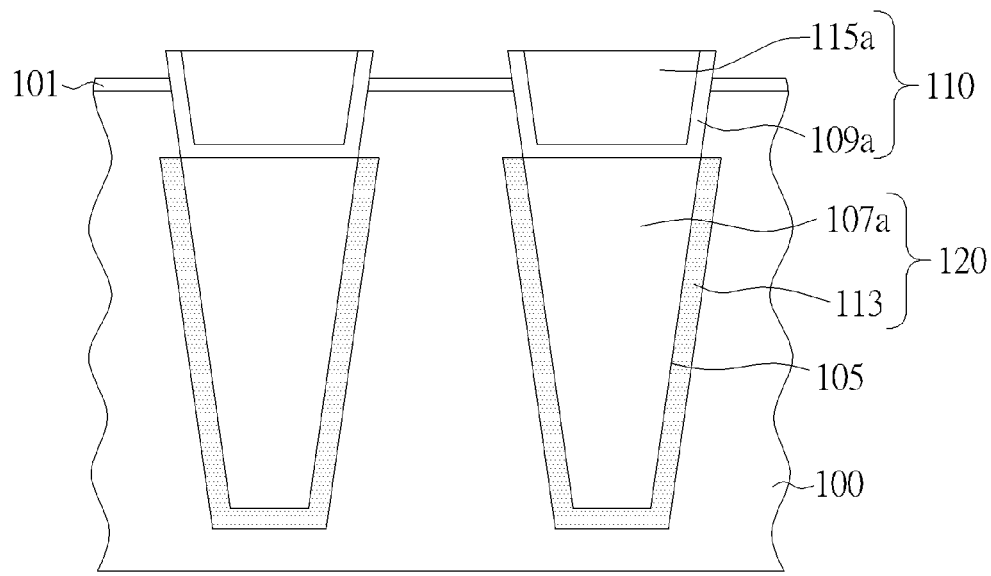
FIG. 14 is a cross-sectional view illustrating a shallow trench isolation structure with an upper insulating portion higher than the surface of the substrate.

There are still other variations of the embodiment of the present invention; for example, as shown in FIG. 13, the process parameters (ex. time or temperature) of the steam annealing process may be controlled to increase the diffusing range of the oxygen atoms in the first insulator 107a, so that the insulating layers 113 of two STI structure are combined into a common insulating layer and an insulating portion of the substrate 100 are formed on the common insulating layer, thereby forming a structure similar to the silicon-on-insulator (SOI) substrate.

Furthermore, the mask layer 103 on the substrate 100 may be removed after the STI structure is completed, for example, through a selective etching process. The removal of the mask layer 103 will make the surface of upper insulating portion 110 of the STI structure higher than the adjacent pad oxide layer 101, thereby defining an active area between adjacent STI structures for forming various kinds of MOS device.

Figure 15:
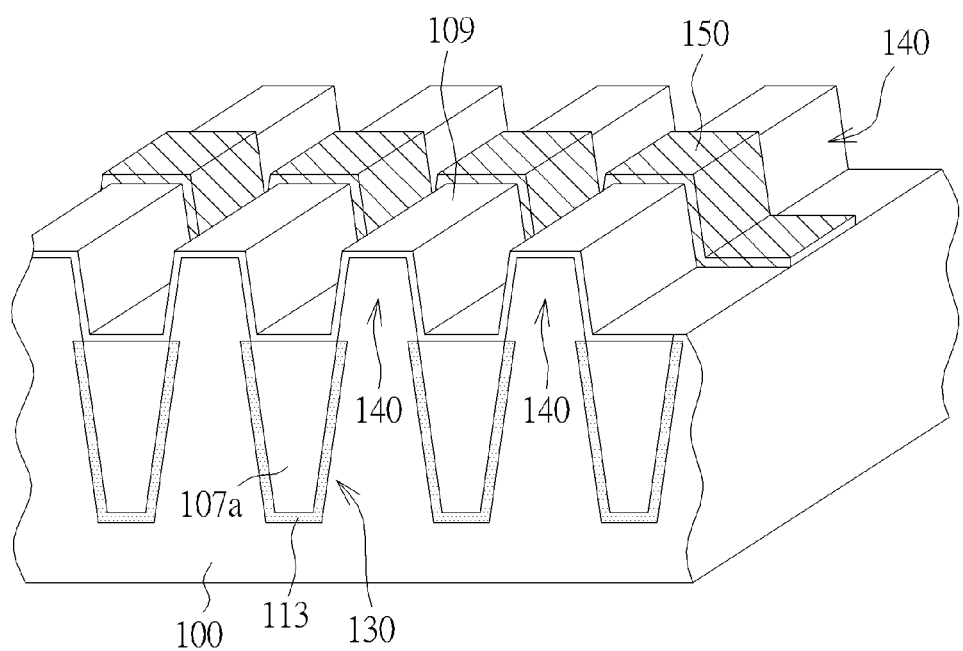
FIG. 15 is a cross-sectional view illustrating the shallow trench isolation structure of present invention in an application of a fin field effect transistor structure.

On the other hand, the method of forming STI structure of present invention is quite compatible to the manufacturing process of the FinFET device. As shown in FIG. 15, the STI structure 130 formed by the method of present invention may serve as the isolating structure between the fin structures 140. The oxidized buffer layer 109 may serve directly as a gate oxide layer or an interfacial layer. High-k material layer (not shown) or a gate structure 150 may be formed thereon and traversing each fin structures 140.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shallow trench isolation structure, comprising:
an upper insulating portion and a lower insulating portion in a trench of a substrate, wherein said lower insulating portion comprises a first insulator and an insulating layer on the sidewall and the bottom of said first insulator, said upper insulating portion comprises a second insulator and a buffer layer on the sidewall and the bottom of said second insulator, a part of said buffer layer interfaces between said first insulator and said second insulator, and the outer sidewall of said buffer layer and the sidewall of said first insulator are leveled.

2. A shallow trench isolation structure according to claim 1, wherein the material of said first insulator and said second insulator is silicon oxide.

3. A shallow trench isolation structure according to claim 1, wherein the material of said buffer layer comprises stress buffer film, silicon nitride, or silicon carbonitride.

4. A shallow trench isolation structure according to claim 1, wherein said shallow trench isolation structure is an isolating structure between fin field effect transistors.

5. A shallow trench isolation structure according to claim 1, wherein the top surface of said upper insulating portion is higher than the surface of said substrate.

6. A shallow trench isolation structure according to claim 1, further comprising a pad oxide layer and a hard mask layer formed on said substrate.

* * * * *